(12) United States Patent
Katz

(10) Patent No.: US 6,448,490 B1
(45) Date of Patent: *Sep. 10, 2002

(54) ASSEMBLY FOR ATTENUATING EMISSIONS FROM ELECTRONIC SOURCES

(76) Inventor: Joseph M. Katz, 11 Meadow Rd., Old Westbury, NY (US) 11568

(*) Notice: Subject to any disclaimer, the term of this patent is extended or adjusted under 35 U.S.C. 154(b) by 0 days.

This patent is subject to a terminal disclaimer.

(21) Appl. No.: 09/111,172

(22) Filed: Jul. 7, 1998

Related U.S. Application Data

(63) Continuation-in-part of application No. 08/824,328, filed on Mar. 26, 1997, now abandoned, and a continuation-in-part of application No. 08/677,720, filed on Jul. 8, 1996, now Pat. No. 5,777,261, which is a continuation-in-part of application No. 08/285,798, filed on Aug. 4, 1994, now Pat. No. 5,535,439, which is a continuation-in-part of application No. 08/013,399, filed on Feb. 4, 1993, now Pat. No. 5,336,896.

(60) Provisional application No. 60/052,234, filed on Jul. 11, 1997, provisional application No. 60/053,726, filed on Jul. 25, 1997, provisional application No. 60/066,881, filed on Nov. 25, 1997, provisional application No. 60/071,230, filed on Jan. 12, 1998, and provisional application No. 60/076,584, filed on Mar. 3, 1998.

(51) Int. Cl.$^7$ .................................................. H05K 9/00
(52) U.S. Cl. ...................... 174/35 R; 361/816; 455/90; 455/117
(58) Field of Search ................. 174/35 R; 361/816; 455/90, 117, 128, 129

(56) References Cited

U.S. PATENT DOCUMENTS

| | | |
|---|---|---|
| 4,047,109 A | 9/1977 | Sekiguchi |
| 4,658,439 A | 4/1987 | Danielsen et al. |
| 4,725,846 A | 2/1988 | Hendershot |
| 4,800,392 A | 1/1989 | Garay et al. |
| 4,853,790 A | 8/1989 | Dickie |
| 4,868,576 A | 9/1989 | Johnson, Jr. |
| 4,872,022 A | 10/1989 | Schock |
| 4,890,199 A | 12/1989 | Beutler |
| 5,014,160 A | 5/1991 | McCoy, Jr. |
| 5,134,245 A | 7/1992 | Katz |
| 5,181,043 A | 1/1993 | Cooper |
| 5,235,492 A | 8/1993 | Humbert et al. |
| 5,336,848 A | 8/1994 | Katz |
| 5,389,942 A | 2/1995 | Oglesby, Jr. |
| 5,726,383 A * | 3/1998 | Geller et al. ............... 174/35 R |
| 6,112,106 A * | 8/2000 | Crowley et al. ............ 455/575 |

* cited by examiner

Primary Examiner—Hung V. Ngo
(74) Attorney, Agent, or Firm—Carter, Deluca, Farrell & Schmidt, LLP

(57) ABSTRACT

An assembly for shielding EMF/RF radiation emitted from portable telephones including a case having a shielding material capable of attenuating EMF/RF radiation. The case substantially encloses a portable telephone and includes at least one aperture for passage of a connector base. The assembly further includes an antenna capable of radial and tilt motion with respect to the portable telephone. The antenna is mounted to the connector base which is removably attached to the portable telephone and in contact with the case. A handle portion is attached along an exterior portion of the case. A shielding antenna case for shielding EMF/RF radiation emitted from portable telephones is also disclosed. The antenna case includes a shielding material capable of attenuating EMF/RF radiation and substantially encloses an antenna portion of the portable telephone. Attachment tabs are used for affixing the case to the portable telephone by way of fasteners. Also disclosed is a shielding antenna for shielding EMF/RF radiation emitted from portable telephones. The shielding antenna includes a replacement antenna having a shielding material capable of attenuating EMF/RF radiation and an antenna connector base mounted to the antenna. The antenna connector base is removably attached to the portable telephone.

3 Claims, 8 Drawing Sheets

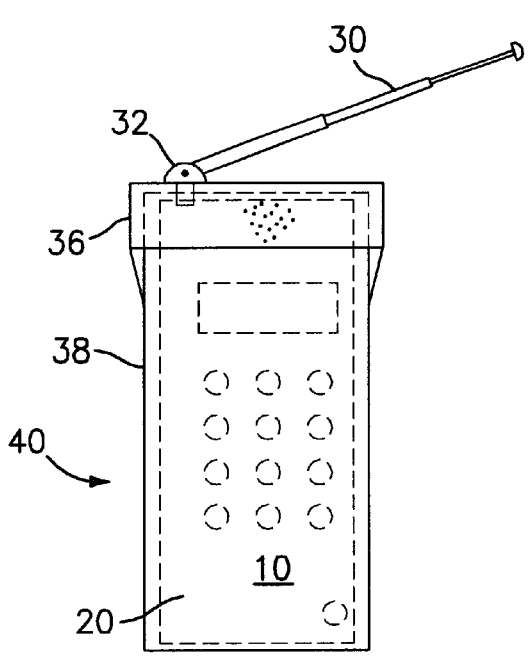
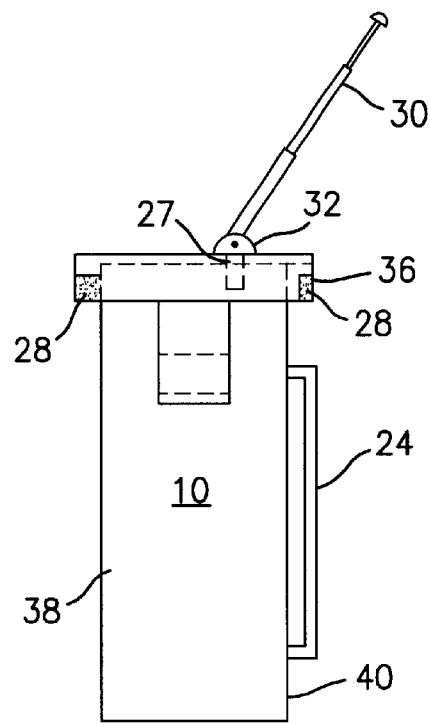
FIG. 9          FIG. 10
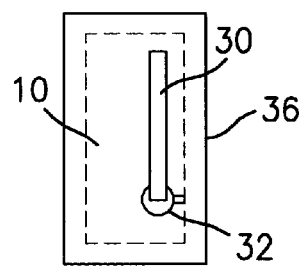
FIG. 11

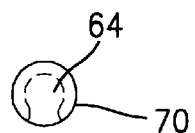
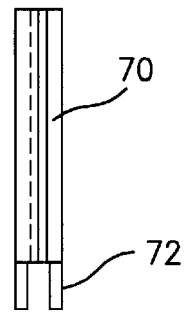
FIG. 23       FIG. 24
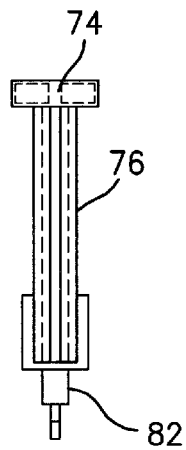 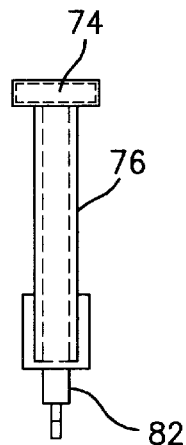
FIG. 25       FIG. 25A
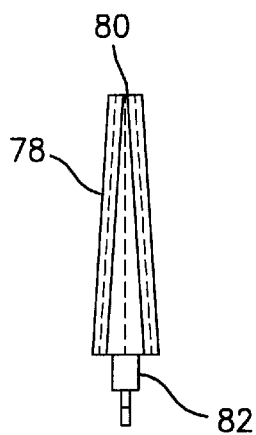 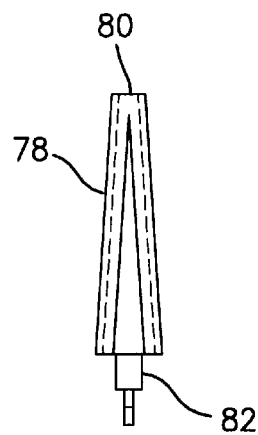
FIG. 26       FIG. 26A

ASSEMBLY FOR ATTENUATING EMISSIONS FROM ELECTRONIC SOURCES

CROSS-REFERENCE TO RELATED APPLICATIONS

This Patent Application claims priority to U.S. Provisional Application Nos. 60/052,234 filed Jul. 11, 1997 and No. 60/053,726 filed Jul. 25, 1997 and No. 60/066,881 filed Nov. 25, 1997 and No. 60/071,230 filed Jan. 12, 1998 and No. 60/076,584 filed Mar. 3, 1998 and is a continuation-in-part of U.S. application Ser. No. 08/824,328 filed Mar. 26, 1997, now abandoned and U.S. application Ser. No. 08/677,720 filed Jul. 8, 1996, now U.S. Pat. No. 5,777,261, which is a continuation-in-part of U.S. application Ser. No. 08/285,798 filed Aug. 4, 1994, now U.S. Pat. No. 5,535,439, which is a continuation-in-part of U.S. application Ser. No. 08/013,399 filed Feb. 4,1993, now U.S. Pat. No. 5,336,896 all of which are incorporated herein by reference in their entirety.

BACKGROUND

1. Technical Field

The present disclosure generally relates to attenuating emissions emitted from electronic sources, and more particularly, to shielding a user from electro-magnetic and microwave radiation emitted from such electronic sources.

2. Background of the Related Art

The present disclosure is directed to protecting a user of electronic sources such as cellular, digital, satellite, portable telephones and communication equipment from electromagnetic and microwave radiation (EMF/RF) emitted therefrom. The portable telephone is compact and lightweight making it a popular item. There are millions of portable telephones and similar communication equipment used throughout the world today including personal telephones, car phones and the like. A persons exposure to electro-magnetic and microwave radiation from portable telephones and their antennas have caused concerns with respect to possible bodily injuries including brain tumors and cancer occurring as a result of usage of such telephones.

The portable telephone broadcasts and receives messages through a mouthpiece and a earphone setup which are received and transmitted through an antenna attached to the telephone. These functions of the telephone use electricity, i.e. from a portable battery, which emits electro-magnetic and microwave radiation. This radiation could be dangerous as used in proximity to the side of a persons head where the antenna is directly placed between the persons ear and mouth. Such exposure to electro-magnetic and microwave radiation so close to a persons head is dangerous, particularly in light of recent scientific discoveries that concluded the brain contains its own type of magnet. Therefore, it is believed as one possibility, the magnet in the brain attracts the emitted rays which over time could have a detrimental effect on the brain cells. The present disclosure is directed to providing protection to users of a portable phone from electro-magnetic and microwave radiation by providing a shield around the portable telephone and antenna to direct and minimize the negative effect of the radiation upon a user's body. See, for example, U.S. Pat. Nos. 5,336,896 and 5,535,439 both of which are herein incorporated by reference in their entirety.

Portable telephones currently used today include one piece fixed antennas which slide into and out of the telephone along a single longitudinal axis. These types of telephones do not have any provisions for adjusting the antenna away from a user's head thereby allowing EMF/RF radiation to come in close contact with the head of a user. One aspect of the present disclosure is aimed at alleviating these dangers by providing antennas which can be telescoped and/or tilted away from the user's head.

The assembly for attenuating emissions from electronic sources of the present disclosure overcomes the difficulties described above and affords other features and advantages heretofore not available by providing a lightweight radiation shielded protection case for containing a portable telephone and associated antenna away from a person's head.

SUMMARY

The present disclosure is directed to an assembly for shielding EMF/RF radiation emitted from portable telephones. The assembly includes a case having a shielding material capable of attenuating EMF/RF radiation. The case substantially encloses a portable telephone and includes at least one aperture for passage of a connector base. The assembly further includes an antenna capable of radial and tilt motion with respect to the portable telephone. The antenna is mounted to the connector base which is removably attached to the portable telephone and in contact with the case. A handle portion is attached along an exterior portion of the case. The shielding case can include two or more separate sections affixed together around a perimeter of the portable telephone. The case includes at least one portion being transparent.

A shielding antenna case for shielding EMF/RF radiation emitted from portable telephones is also disclosed. The case includes a shielding material capable of attenuating EMF/RF radiation and substantially encloses an antenna portion of the portable telephone. Attachment tabs are used for affixing the case to the portable telephone by way of fasteners.

Also disclosed is a shielding antenna for shielding EMF/RF radiation emitted from portable telephones. The shielding antenna includes a replacement antenna having a shielding material capable of attenuating EMF/RF radiation and an antenna connector base mounted to the antenna. The antenna connector base is removably attached to the portable telephone. The antenna shielding material is a shielding case coupled to a perimeter of the replacement antenna.

BRIEF DESCRIPTION OF THE DRAWINGS

The objects and features of the present disclosure, which are believed to be novel, are set forth with particularity in the appended claims. The present disclosure, both as to its organization and manner of operation, together with further objectives and advantages may best be understood by reference to the following description, taken in connection with the accompanying drawings, in which:

FIG. 9 is a view illustrating an alternate embodiment of the shielding case according to the present disclosure;

FIG. 10 is a side view illustrating the embodiment of FIG. 9 with antenna and carry handle;

FIG. 11 is a top view illustrating the embodiment of FIG. 9;

FIG. 23 is a top view illustrating the shielding case of FIG. 21;

FIG. 24 is a side view illustrating the shielding case of FIG. 21;

FIG. 25 is a rear view illustrating an alternate embodiment of a shielded antenna case;

FIG. 25A is a front view illustrating the antenna case of FIG. 25;

FIG. 26 is a rear view illustrating an alternate embodiment of a stubby-type shielded antenna case; and FIG. 26A is a front view illustrating the antenna case of FIG. 26.

DETAILED DESCRIPTION OF PREFERRED EMBODIMENTS

Figure 1:
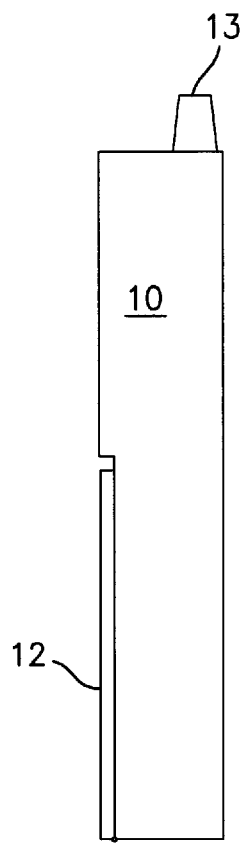
FIG. 1 is a view illustrating a flip-door type portable telephone with the door in a closed position.

The preferred embodiments of the apparatus and methods disclosed herein are discussed in terms of cellular and digital portable telephones. It is envisioned, however, that the disclosure is applicable to a wide variety of communication devices including, but, not limited to marine and ship telephones, car phones, satellite and mobile telephones and the like.

Reference will now be made in detail to the preferred embodiments of the disclosure, which are illustrated in the accompanying figures. Turning now to the figures, wherein like components are designated by like reference numerals throughout the various figures, attention is first directed to FIGS. 1–8A.

Figure 2:
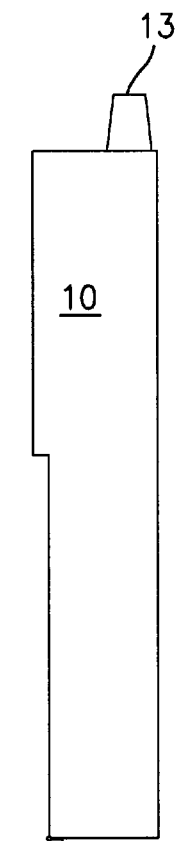
FIG. 2 is a view illustrating the telephone of FIG. 1 with the door in an open position.
Figure 3:
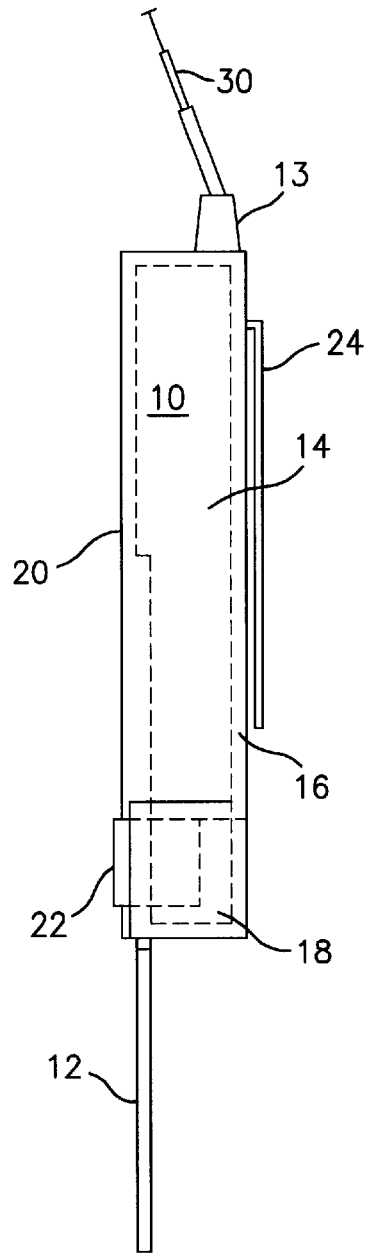
FIG. 3 is a view illustrating the shielding case according the present disclosure and the telephone of FIG. 2.
Figure 4:
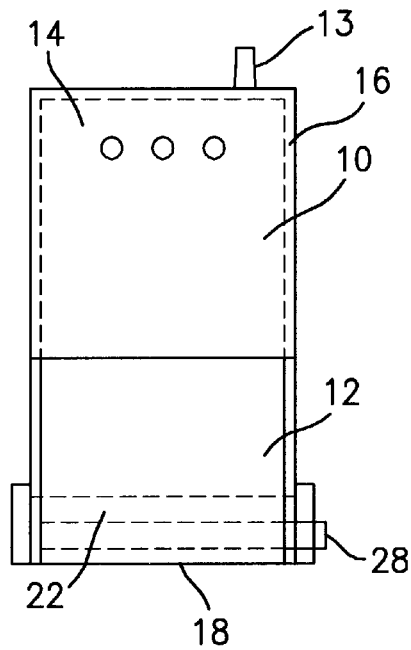
FIG. 4 is a front view illustrating the shielding case and telephone of FIG. 3 with the door in a closed position.
Figure 5:
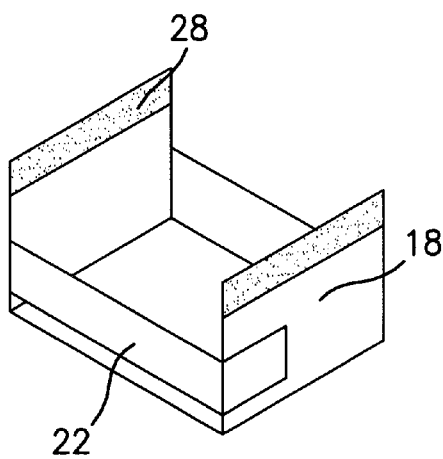
FIG. 5 is a view illustrating the shielding case cap and strap of the telephone of FIG. 3.
Figure 6:
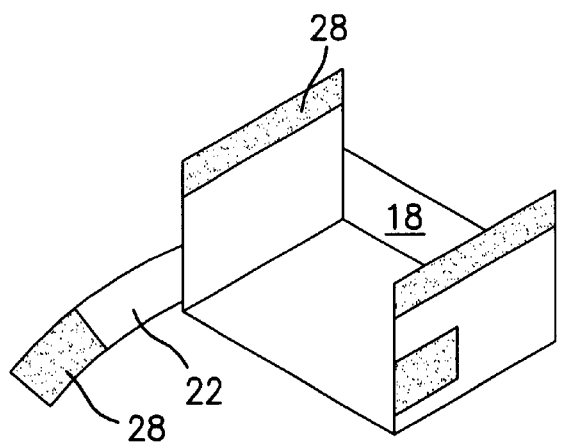
FIG. 6 is a view illustrating the cap of FIG. 5 with the strap in an open position.
Figure 7:
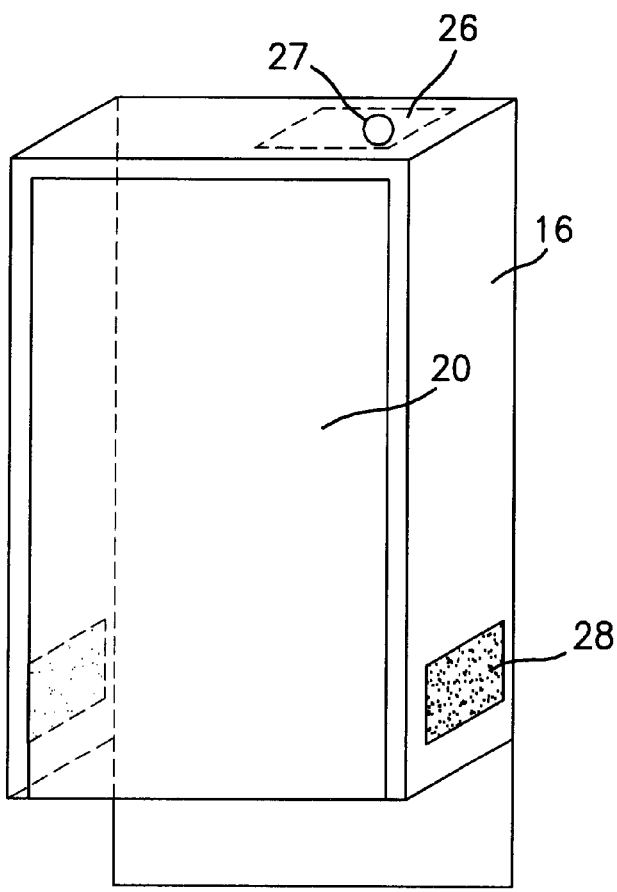
FIG. 7 is a view illustrating a top portion of the shielding case of FIG. 3.
Figures 8, 8A:
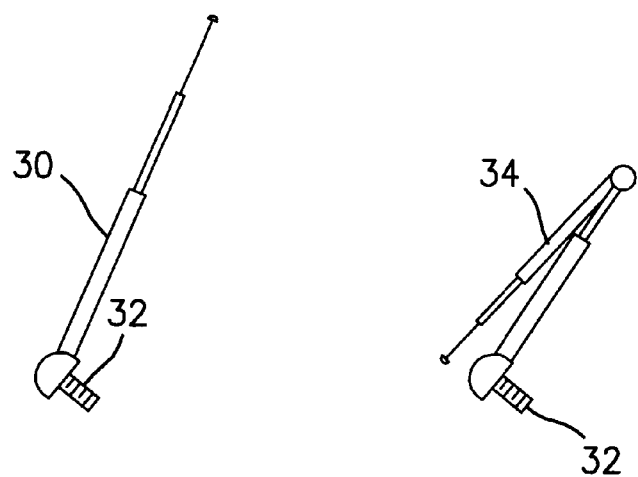
FIG. 8 is a view illustrating an antenna of the shielding case according to the present disclosure.
FIG. 8A is a view illustrating an alternate embodiment of an antenna of the shielding case according to the present disclosure.
Figure 13:
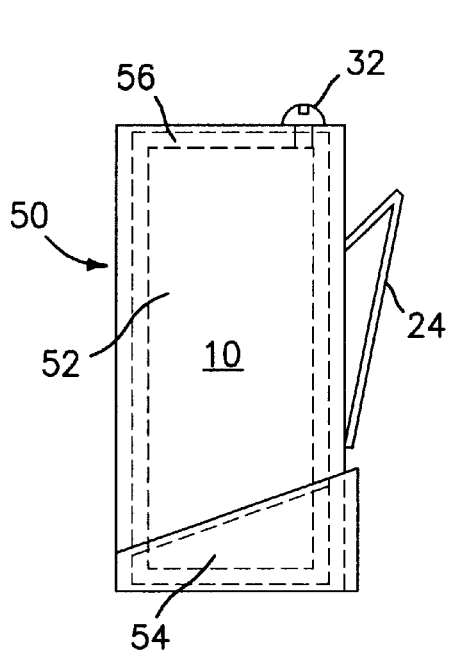
FIG. 13 is a side view illustrating the embodiment of FIG. 12 with antenna and carry handle.
Figure 12:
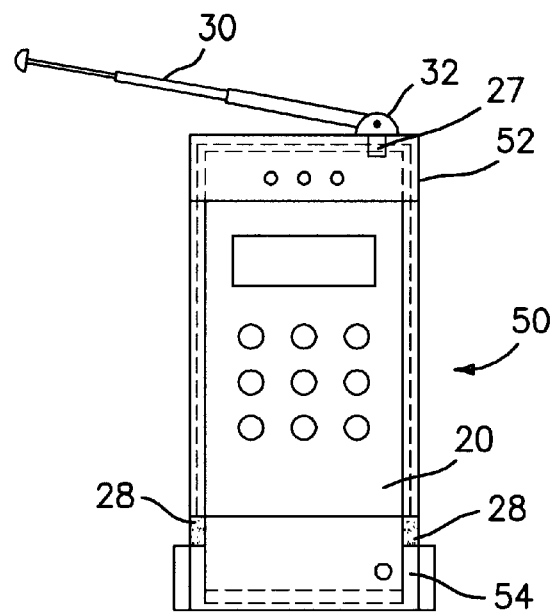
FIG. 12 is a view illustrating an alternate embodiment of the shielding case according to the present disclosure.
Figure 14:
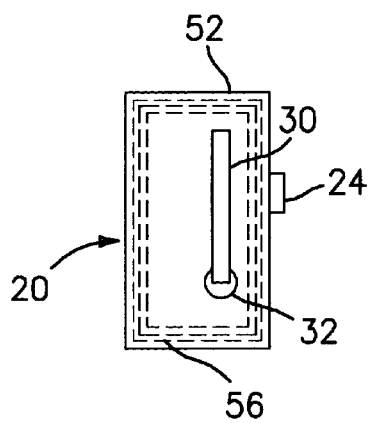
FIG. 14 is a top view illustrating the embodiment of FIG. 12.
Figure 15:
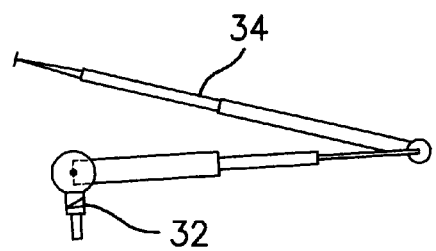
FIG. 15 is a view illustrating a tilt and swivel connector and antenna of the embodiment of FIG. 12.
Figure 16:
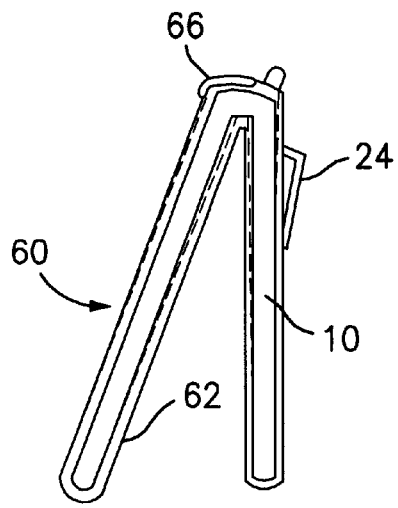
FIG. 16 is a view illustrating an alternate embodiment according to the present disclosure depicting a shielding case of a folding-type telephone.
Figure 17:
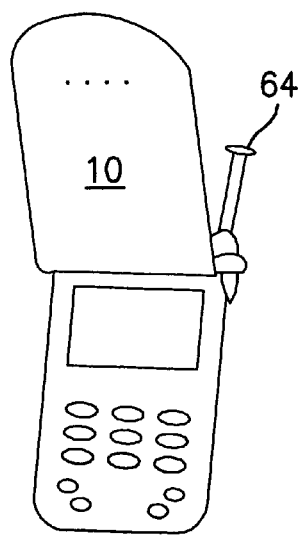
FIG. 17 is a view illustrating the folding-type telephone of FIG. 16 in an open position.
Figure 17A:
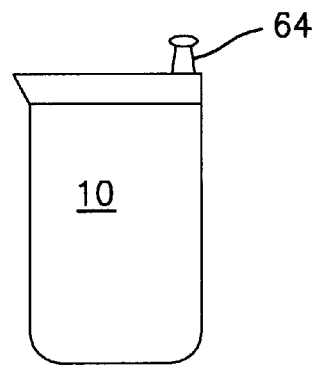
FIG. 17A is a view illustrating the folding-type telephone of FIG. 17 in a closed position.
Figure 18A:
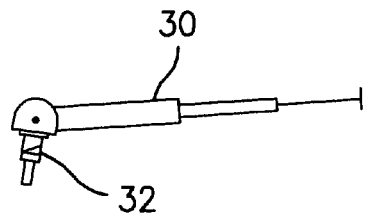
FIG. 18A is a view illustrating a single section telescoping antenna with tilt and swivel base connector for use with the embodiment of FIG. 16.
Figure 18:
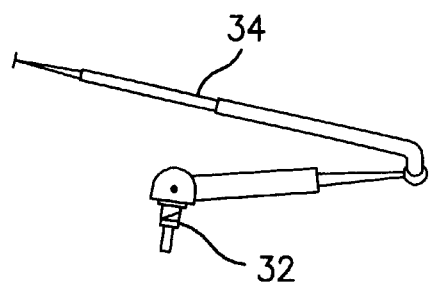
FIG. 18 is a view illustrating a multiple sections telescoping antenna with tilt and swivel base connector for use with the embodiment of FIG. 16.
Figure 19:
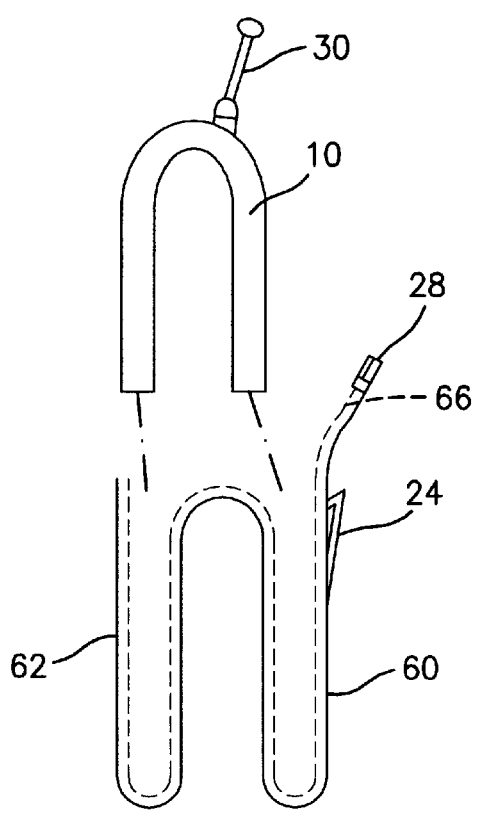
FIG. 19 is a view illustrating the partially opened folding-type telephone and shielding case of FIG. 16.
Figure 20:
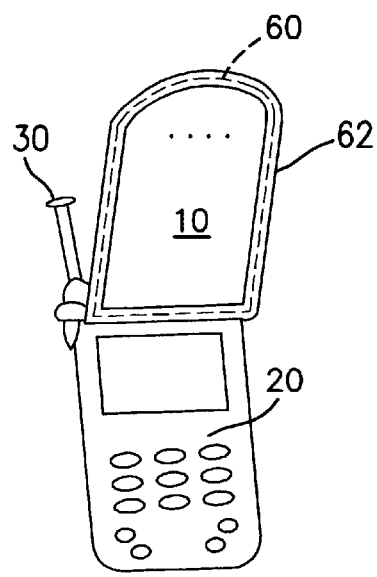
FIG. 20 is a view illustrating the fully opened folding-type telephone and shielding case of FIG. 16.
Figure 21:
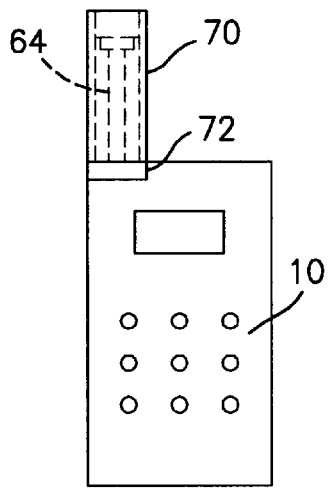
FIG. 21 is a view depicting an alternate embodiment of the shielding case according to the present disclosure showing the front of a telephone and an antenna shielding case.
Figure 22:
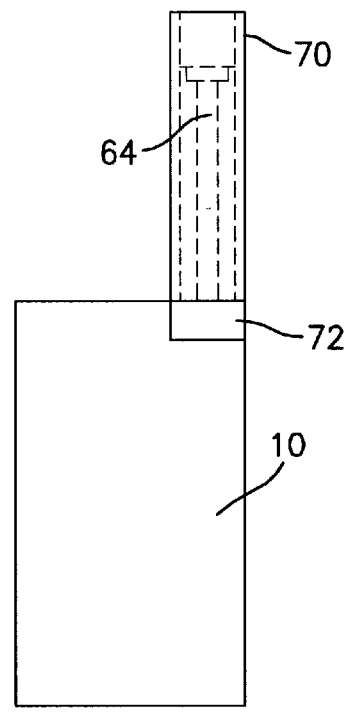
FIG. 22 is a rear view illustrating the shielding case of FIG. 21.

A flip-up/down type portable telephone 10 of the type which emits electromagnetic and microwave radiation (EMF/RF) is generally shown in FIGS. 1 and 2. The telephone 10 includes a flip up/down door 12 which serves as a microphone and/or protective guard for a keypad display (not shown). An antenna connector 13 is situated along an outer periphery of the phone for connection to an external antenna 30. A shielding case 14 includes a top portion 16 and bottom cap portion 18. The case 14 is manufactured of materials which provide complete protection against EMF/RF radiation for a user. As is shown in FIGS. 3 and 7, the top portion 16 is preferably sized to accommodate a particular shape of portable telephone 10. The cap portion 18 is removable in order to insert and remove the telephone 10 into case 14. Top portion 16 includes an aperture 27 for receiving antenna connector 13 and antenna 30. As is best shown in FIG. 7, case 14 includes a transparent front portion 20 which shields EMF/RF radiation and which allows a user to operate the keypad of telephone 10. Removable cap portion 18 includes a strap portion 22 which allows door 12 to open and close when case 14 is installed over telephone 10. A handle 24 for carrying the telephone 10 is situated along an outer portion of case 14.

With reference to FIGS. 4–8A, telephone 10 with door 12 in the closed position and case 14 with strap portion 22 is shown. Strap portion 22 is closed using fasteners 28 such as hook-and-loop fasteners 28, e.g. VELCRO™ brand fasteners. Cap portion 18 is removably joined to top portion 16 of case 14 with fasteners 28 although any type of fastener such as zippers, buttons, clasps or adhesives is contemplated. A conductivity guard 26 is situated in case 14 along antenna connector 13 for ensuring proper ground to antenna 30.

Antenna connector 13 is fitted with an antenna 30 through antenna connector aperture 27 located along the top portion 16 of case 14. Antenna connector 13 preferably includes a swivel-tilt base 32 which allows for radial and tilt movement of antenna 30 with respect to telephone 10. The antenna 30 can be of any type known in the portable telephone art such as the typical telescoping antenna 30 and the telescoping antenna with hinged telescoping sections 34.

Installation of the shielding case 14 according to the present disclosure will now be discussed. The original equipment antenna is removed from antenna connector 13 and replaced with swivel and tilt antenna 30. The top portion 16 of shielding case 14 is then slipped over telephone 10 with transparent front portion 20 facing the keypad and allowing antenna connector 13 and antenna 30 to pass through the aperture of top potion 16. Cap 18 with strap portion 22 open is slipped telescopically over top portion 16 and fastened thereto with fasteners 28. Strap portion 22 is extended across a front portion of cap 18 and fastened to its appropriate fastener an external surface of cap 18. The door 12 is then closed over cap 18, strap 22 and top portion 16 to complete the installation process. It is contemplated that in any of the embodiments discussed within the present disclosure may include a shielding case with holes for allowing the passage of sound from the speaker and to the microphone of the portable telephone. It is further envisioned that the shielding cases of the present disclosure be entirely manufactured from commercially available materials which provide protection against EMF/RF radiation.

With reference to FIGS. 9–11, an alternative embodiment of the present disclosure is shown wherein like components which correspond to those of shielding case 14 are designated by like reference numerals. Shielding case 40 includes similar component structures as described in previous embodiments. As such, shielding case 40 includes a top or cap portion 36 fastened to a bottom portion 38 which combine along an outer periphery of telephone 10 to completely shield the telephone within shielding case 40. Similarly, a transparent face 20 is included along at least one side of bottom portion 38 to enable a user to view and use the keypad of telephone 10. Top or cap portion 36 includes an aperture 27 for passage of antenna swivel base 32 and antenna 30. A handle 24 for carrying the telephone 10 is situated along an outer portion of case 40. The antenna 30 can be of any type known in the portable telephone art such as the typical telescoping antenna 30 and the telescoping antenna with hinged telescoping sections 34.

Installation and use of the shielding case 40 according to the present disclosure will now be discussed. The original equipment antenna is removed and replaced with swivel and tilt antenna 30. The bottom portion 38 of shielding case 40 is then slipped over telephone 10 with transparent front portion 20 facing the keypad. Top portion 36, as well as, transparent face portion 20 include through holes for the passage of sound and speech, respectively. Cap portion 36 is then placed over bottom portion 38 while allowing antenna 30 to pass through the aperture of cap portion 36. Cap portion 36 is then fastened to bottom portion 38 using fasteners 28. Use of the telephone 10 simply requires pulling antenna 30 outwardly and away from the user's head and dialing the keypad as is customary.

With reference to FIGS. 12–15, an alternative embodiment of the present disclosure is shown wherein like components which correspond to those of shielding cases 14 and 40 are designated by like reference numerals. Shielding case 50 includes similar component structures as described in previous embodiments. As such, shielding case 50 includes a top portion 52 fastened to a bottom portion 54 which combine along an outer periphery of telephone 10 to completely shield the telephone within shielding case 50. Similarly, a transparent face 20 is included along at least one side of top portion 52 to enable a user to view and use the keypad of telephone 10. Top portion 52 includes an aperture 27 for passage of antenna swivel base 32 and antenna 30. Top portion 52 and/or bottom portion 54 can include cushion sections 56 along an inner or outer periphery thereof. It is contemplated that the presently disclosed embodiments can include cushion sections 56 which are designed to provide both protection to the telephone 10 and to provide comfort to a user. A handle 24 for carrying the telephone 10 is situated along an outer portion of case 50. The antenna 30 can be of any type known in the portable telephone art such as the typical telescoping antenna 30 and the telescoping antenna with hinged telescoping sections 34.

Installation and use of shielding case 50 according to the present disclosure will now be discussed. The original equipment antenna is removed and replaced with swivel and tilt antenna 30. The top portion 52 of shielding case 50 is then slipped over telephone 10 with transparent front portion 20 facing the keypad and allowing antenna swivel base 32 and antenna 30 to pass through the aperture of top portion 52. Top portion 52, as well as, transparent face portion 20 include through holes for the passage of sound and speech, respectively. Bottom portion 54 is then placed over telephone 10 and fastened to top portion 52 using fasteners 28. Use of the telephone 10 simply requires pulling antenna 30 outwardly and away from the user's head and dialing the keypad in the customary manner.

With reference to FIGS. 16–20, an alternative embodiment of the present disclosure is shown wherein like components which correspond to those of shielding cases 14, 40 and 50 are designated by like reference numerals. Shielding case 60 includes similar component structures as described in previous embodiments. As such, shielding case 60 includes a V-shaped housing 62 and flap portion 66 which are fastened together along an outer periphery of telephone 10 via fastener elements 28 to completely shield the telephone within shielding case 60. Similarly, a transparent face 20 is included along at least one side of housing 62 to enable a user to view and use the keypad of telephone 10. Flap portion 66 includes an aperture (not shown) for passage of antenna swivel base 32 and antenna 30. A handle 24 for carrying the telephone 10 is situated along an outer portion of case 60. The antenna 30 can be of any type known in the portable telephone art such as the typical telescoping antenna 30 and the telescoping antenna with hinged telescoping sections 34.

Installation and use of shielding case 60 according to the present disclosure will now be discussed. The original equipment antenna 64 is removed and replaced with swivel and tilt antenna 30. The housing 62 of shielding case 60 is then slipped over telephone 10 with transparent front portion 20 facing the keypad. Flap portion 66 is then fastened to housing 62 via fasteners 28 while allowing antenna swivel base 32 and antenna 30 to pass through the aperture of flap portion 66. Housing 62, as well as, transparent face portion 20 include through holes for the passage of sound and speech, respectively. Use of the telephone 10 simply requires pulling antenna 30 outwardly and away from the user's head and dialing the keypad as is customary.

With reference to FIGS. 21–26, alternative embodiments of the present disclosure are shown wherein like components which correspond to those of shielding cases 14, 40, 50 and 60 are designated by like reference numerals. Portable telephone 10 and original equipment antenna 64 are provided with an EMF/RF shielding case 70 having attachment tabs 72 for fastening to telephone 10. Shielding case 70 is placed over original antenna 64 and attached to telephone 10 via tabs 72 or other type fasteners as previously described. FIGS. 23 and 24 show a top and side view of shielding case 70 having a circular periphery. It is contemplated that shielding case 70 can be of any suitable shape which fully encompasses antenna 64. Installation of shielding case 70 is accomplished by placing case 70 over original equipment antenna 64 and fastening attaching tabs 72 to telephone 10.

With reference to FIGS. 25–26, alternative embodiments depicting shielded antennas 74 and 80 are shown. Depicted in FIGS. 25 and 25A are respective rear and front views of antenna 74 including shielded case 76 and antenna connector 82 for connection to telephone 10. Similarly at FIGS. 26 and 26A, stubby-type antenna 80 includes shielded case 78 and antenna connector 82 for connection to telephone 10. Installation of the present embodiments to telephone 10 includes removal of original equipment antenna 64 and replacement with antennas 74 or 80.

It will be understood that various modifications may be made to the embodiments disclosed herein. For example, the shielding cases of the present disclosure may be manufactured to accommodate various shaped portable telephones and respective antennas. Also, antennas disclosed herein may be formed of a pliable material which can be bent away for a user's head while the telephone is in use. Therefore, the above description should not be construed as limiting, but merely as exemplifications of preferred embodiments. Those skilled in the art will envision other modifications within the scope and spirit of the claims appended hereto.

What is claimed is:

1. An assembly for shielding EMF/RF radiation emitted from a portable telephone having a housing, said assembly comprising:

a case including a shielding material capable of attenuating EMF/RF radiation, said case being dimensioned to substantially enclose all sides of the housing of a portable telephone, and including an aperture for accessing an antenna connector of the portable telephone;

a conductivity guard positioned on said case to surround said aperture;

a removable antenna capable of radial tilting motion with respect to the antenna connector of the portable telephone, said antenna adapted to be mounted to the antenna connector of the portable telephone; and a handle portion attached to an exterior portion of said case.

2. The assembly according to claim 1, wherein said case includes two separate sections affixed together dimensioned to be received about the housing of a portable telephone.

3. The assembly according to claim 1, wherein at least a portion of said case is transparent.

* * * * *